United States Patent [19]

Yang

[11] Patent Number: 4,891,826
[45] Date of Patent: Jan. 2, 1990

[54] METHOD OF OPERATING A CHARGE-COUPLED DEVICE TO REDUCE SPILLBACK

[75] Inventor: Kei-Wean C. Yang, Beaverton, Oreg.

[73] Assignee: Tektronix, Inc., Beaverton, Oreg.

[21] Appl. No.: 270,912

[22] Filed: Nov. 14, 1988

[51] Int. Cl.[4] .................. G11C 19/28; H01L 29/78
[52] U.S. Cl. .................................... 377/58; 357/24
[58] Field of Search .................. 357/24; 377/57–63

[56] References Cited

U.S. PATENT DOCUMENTS

| | | | |
|---|---|---|---|
| 3,902,186 | 8/1975 | Engeler et al. | 357/24 |
| 4,612,521 | 9/1986 | Kleefstra et al. | 357/24 |
| 4,636,826 | 1/1987 | Slotboom et al. | 357/24 |

Primary Examiner—Gene M. Munson
Attorney, Agent, or Firm—John Smith-Hill

[57] ABSTRACT

A charge-coupled device comprises a body of semiconductor material having a channel along which charge can be transferred in a predetermined transfer direction by charge carriers of a first polarity, and a plurality of gates over the channel, the gates being in n sets, where n is an integer greater than unity. The gates of the jth set, where j is in the range of 1 to n, are longer in the transfer direction than the gates of the kth set, which precede the gates of the jth set. The kth set of gates are driven between first and second potential levels of which the first potential level is of the first polarity relative to said second potential level, and the jth set of gates are driven between third and fourth potential levels of which the third potential level is of the first polarity relative to the fourth potential level and is of a second polarity relative to the first potential level.

18 Claims, 6 Drawing Sheets

METHOD OF OPERATING A CHARGE-COUPLED DEVICE TO REDUCE SPILLBACK

BACKGROUND OF THE INVENTION

This invention relates to a method of operating a charge-coupled device.

FIG. 1 of the accompanying drawings illustrates schematically a four-phase CCD fabricated on a p-type silicon die 2 having an n-type buried channel 4. A layer of dielectric material (not shown) overlies the upper surface of the die, and conductive gates 8 are formed over the dielectric layer. The device may be fabricated by use of known MOS technology. Thus, the dielectric layer is made of silicon dioxide and the gates 8 are made of polysilicon and are deposited in two stages over the dielectric layer so that each two adjacent gates comprise a lower level polysilicon gate and an upper level polysilicon gate that partially overlaps the adjacent lower level gate(s). This method of fabricating a CCD, applied to a two-phase device, is described in Kim, "Two-Phase Coupled Linear Imaging Devices With Self-Aligned Implanted Barrier," International Electron Device Meeting, 1974.

A transfer clock driver 10 generates a four-phase clock signal. The clock signal has a rectangular voltage waveform, with the four clock phases being offset in phase relative to each other by 90° as shown in FIG. 2. Each gate is connected to one of the four clock phases, so that a gate $8_1$ connected to clock phase 1 is positioned between a gate $8_4$ connected to clock phase 4 and a gate $8_2$ connected to clock phase 2, and a gate $8_3$ connected to clock phase 3 is positioned between a gate $8_2$ connected to clock phase 2 and a gate $8_4$ connected to clock phase 4. Thus, four sets of gates are defined, connected to the first, second, third and fourth clock phases respectively, and four sets of storage cells 12 are formed in the channel 4 beneath the four sets of gates respectively. The cells may also be considered to be in groups each containing a cell $12_1$ and the three succeeding cells $12_2$, $12_3$ and $12_4$.

The waveforms in FIG. 1 represent the channel potential at the times indicated in FIG. 2 as $t_1$, $t_2$, $t_3$ and $t_4$. At the time $t_1$, clock phases 1 and 4 are both high and clock phases 2 and 3 are both low, and accordingly, for each group of four gates the voltages applied to the gates establish a potential well in the cell $12_4$ of one group and the cell $12_1$ of the next group, between potential barriers established in the cells $12_3$ and $12_2$ that immediately precede and succeed the cells $12_4$ and $12_1$ respectively. A charge packet of electrons is trapped in the potential well.

At time $t_2$, the voltage of phase 4 has fallen and therefore the channel potential in the cell $12_4$ has increased to the same level as the channel potential in the cell $12_3$. The channel potential in the cell $12_2$ has decreased to the level of the channel potential in the cell $12_1$. When the channel potential in the cell $12_4$ increases, charge present in the cell $12_4$ of a group of cells will be transferred forwards into the potential well defined by the cells $12_1$ and $12_2$ of the next group. However, if the clock edge is very fast, such as would occur of the CCD is used as the acquisition stage of a high speed analog-to-digital converter, a significant proportion of the charge will spill back into the potential well defined by the cells $12_1$ and $12_2$ of the group that includes the cell $12_4$. A similar spill back occurs when phase 1 falls to its low level, as indicated at time $t_3$.

FIG. 3 is an enlarged view of the voltage waveform applied to the gates. FIG. 3 shows that the voltage level does not change instantaneously, but over an interval from the time $t_5$ to the time $t_6$. This interval may be about one-tenth of the clock period. Under low charge level conditions, the interval from $t_5$ to $t_6$ is the time available for charge to transfer from one cell (the transferring cell) to the next succeeding cell (the receiving cell) with no possibility of spill back. At the time $t_6$, when the clock voltage reaches its minimum level, the channel potential of the transferring cell reaches its maximum level, which is the same as the channel potential of the preceding cell, and spill back can occur. Under high charge level conditions, such that the Fermi level in the transferring cell is raised, spill back can occur before the time $t_6$.

It is known to employ a four-phase charge-coupled device (CCD) in a serial-parallel-serial (SPS) analog shift register for high speed signal acquisition. See, for example, U.S. Pat. No. 4,725,748, issued Feb. 16, 1988 (Hayes et al).

An SPS analog shift register comprise an input serial register, an output serial register, and a parallel register that connects the input serial register to the output serial register. The parallel register is composed of multiple segments, each comprising a serial register, extending between the input register and the output register. An input signal is sampled at an input diode of the input register and consecutive samples are shifted through the input register. When the input register is full, the samples are shifted into respective segments of the parallel register, emptying the input register. The input register is filled and emptied again, and as each group of samples is shifted into the parallel register the samples that were previously shifted into the parallel register are advanced by one step through the parallel register. Ultimately, each group of samples reaches the output register, and is shifted serially through the output register to an output node of the SPS shift register.

Part of a practical implementation of the SPS register described in U.S. Pat. No. 4,725,748 is illustrated diagramatically in FIG. 4. FIG. 4 shows a portion of the input serial register 20 at its junctures with two of the segments 22, 24 of the parallel register. In FIG. 4, the lower level gates are marked in solid lines, the upper level gates in dashed lines, and the buried channel in dot-dashed lines. The efficiency with which charge is transferred along a CCD shift register depends on the length of the cells that are defined in the channel beneath the gates respectively: the shorter the cells, the greater the efficiency. The length of the longest cell limits the efficiency of the CCD. The length of a cell is the maximum distance that must be traveled by signal charge in order to leave the cell. It is clear from inspection of FIG. 4 that the maximum distance D that signal charge must travel in the serial direction in order to pass from an odd cell to an even cell is greater than the maximum distance d that the signal charge needs to travel in the serial direction in order to pass from an even cell to an odd cell. This is particularly so in the case of the cell $12_1$, where charge may enter the region at the upper end of the segment 22 of the parallel register because of the need to provide a space between the first gate of the parallel register, which is a lower level gate, and the lower level gates of the serial input register.

The problem of charge spill back is less serious with cells that are short (in the direction of charge transfer) than with cells that are long. This is because more charge is transferred from a transferring cell to its receiving cell before the clock voltage applied to the gate over the transferring cell reaches its final low level in the case of a short transferring cell than in the case of a long transferring cell.

Spill back may affect the charge transfer efficiency of a CCD. The charge transfer efficiency (CTE) of a charge coupled device is the ratio of charge transferred to a storage cell from its neighboring cell during a clock phase to the initial charge in the neighboring cell at the beginning of the clock phase. A high CTE is desirable, to prevent substantial degradation of the signal passing through the device.

FIG. 5 represents the electrical characteristics of a four phase CCD of known type. In FIG. 5, curve A represents variation in CTE (right ordinate) as a function of common mode voltage (bias charge) while curve B represents the differential CCD output (left ordinate) in response to a two-volt input pulse as a function of common mode voltage. It will be noted that the curve B is composed of two substantially linear segments joined by a curved portion. It is desirable to operate the CCD within a range of common mode voltages for which the curve B is linear. Typically the common mode voltage varies by about two volts during operation of a CCD. In the case of FIG. 5, this indicates that the common mode voltage cannot be higher than about 9 volts, which implies that the CTE is about 0.995.

In an implementation of the SPS register that is illustrated diagrammatically in FIG. 4, the difference in cell length between the longer cells and the shorter cells is about 45%, but the area of the shorter, rectangular cells is about the same as the area of the longer, delta-shaped cells and therefore the Fermi level in the shorter cells is not affected significantly by the charge level. If the cells were all rectangular and of the same width, and the longer cells were more than about 20% longer than the shorter cells, the area of the shorter cells would be significantly less than the area of the longer cells. If such a CCD were operated at a high charge level, spill back might be exacerbated by the increase in Fermi level in the shorter cells. FIG. 6 illustrates a three-phase CCD in which the cells $14_1$ are substantially longer than the cells $14_2$ and $14_3$. When phase 1 is low and phases 2 and 3 are high, charge is stored in the cells $14_2$ and $14_3$ (waveform A). If the FIG. 6 CCD is operated at a high charge level, the quantity of charge stored in the cell $14_2$ increases the Fermi level in the cell and results in the channel potential in the cell $14_2$ being substantially higher, indicated by a dashed line, than it would be at a lower charge level (solid line). Therefore, when phase 2 starts to go low, the channel potential in the cell $14_2$ reaches the same level as in the cell $14_1$ before the phase 2 clock potential reaches its low level, and spill back can occur. Waveforms C and D indicate the channel potential profile when phase 2 reaches its low level and when phase 1 has risen to its high level, respectively.

SUMMARY OF THE INVENTION

A preferred embodiment of the invention in a first aspect is a charge-coupled device comprising a body of semiconductor material having a channel along which charge can be transferred in a predetermined direction by charge carriers of a first polarity, and a plurality of gates over the channel, the gates being in n sets, where n is an integer greater than three, such that a gate of the first set is preceded by a gate of the nth set in said predetermined direction and is succeeded by a gate of the second set, a gate of the ith set (where i is an integer greater than 1 and less than n) is preceded by a gate of the $(i-1)$th set and is succeeded by a gate of the $(i+1)$th set, and a gate of the nth set is preceded by a gate of the $(n-1)$th set and is succeeded by a gate of the first set, at least one gate being longer in the predetermined direction than the preceding gate. The device also comprises means for driving the gates each between first and second potential levels of which the first potential level is of said first polarity relative to said second potential level, the first potential level to which said one gate is driven being different from the first potential level to which said preceding gate is driven.

A preferred embodiment of the invention in a second aspect is a method of operating a charge-coupled device comprising a body of semiconductor material having a channel along which charge can be transferred in a predetermined direction by charge carriers of a first polarity, and a plurality of gates over the channel, the gates being in n sets, where n is an integer greater than two, and the gates of the jth set, where j is in the range from 1 to n, being longer in the predetermined direction than the gates of the kth set, where the gates of the kth set precede the gates of the jth set. The method comprises driving the kth set of gates between first and second potential levels of which the first potential level is of said first polarity relative to said second potential level, and driving the jth set of gates between third and fourth potential levels of which the third potential level is of said first polarity relative to the fourth potential level and is different from said first potential level.

BRIEF DESCRIPTION OF DRAWINGS

For a better understanding of the invention and to show how the same may carried into effect, reference will now be made, by way of example, to the accompanying drawings in which.

DETAILED DESCRIPTION

Figure 1:
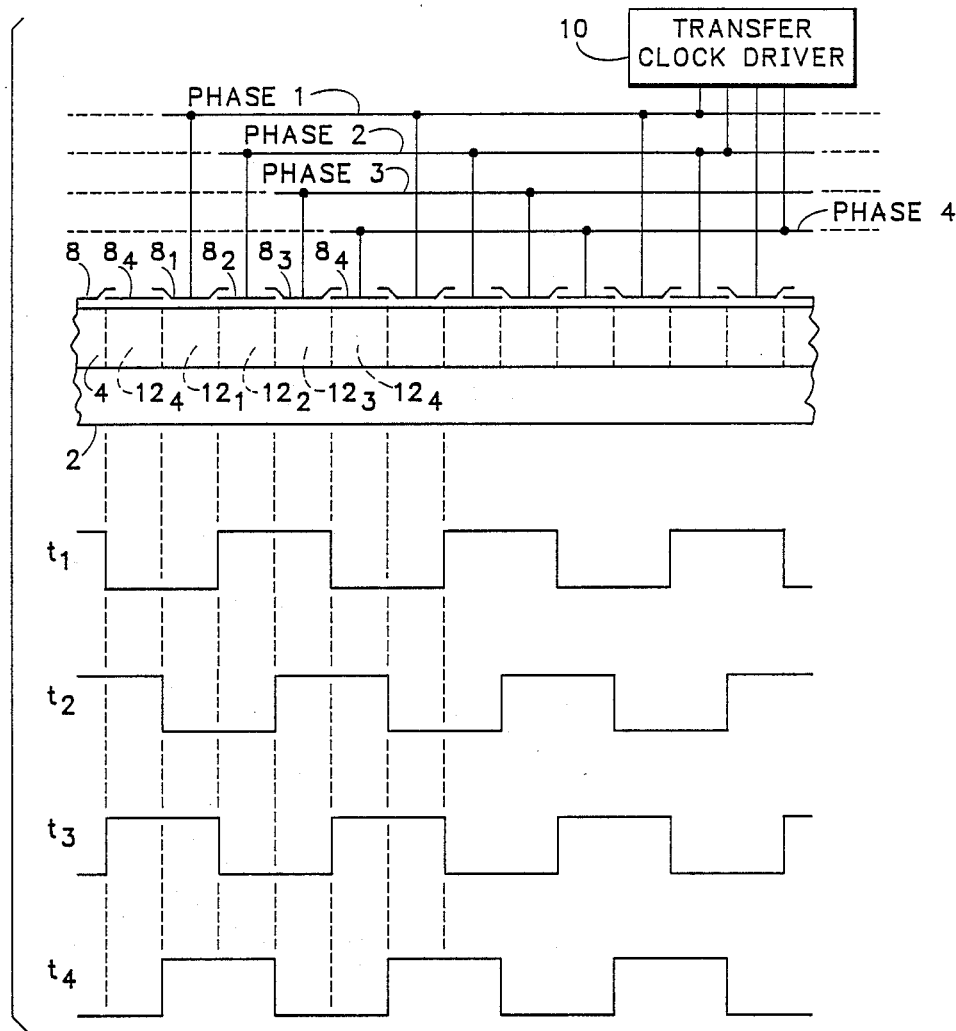
FIG. 1 is a schematic illustration of a four-phase CCD.
Figure 2:
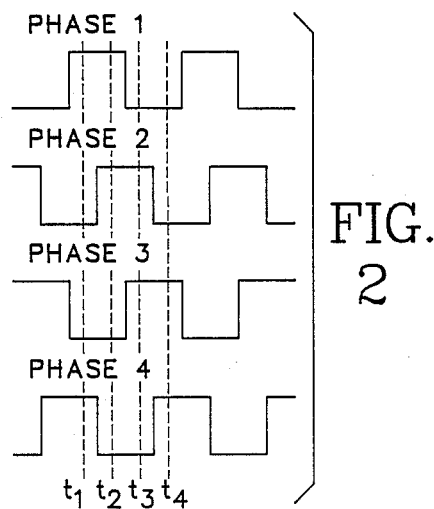
FIG. 2 illustrates the voltage waveforms that are utilized in operating the FIG. 1 CCD.
Figure 3:
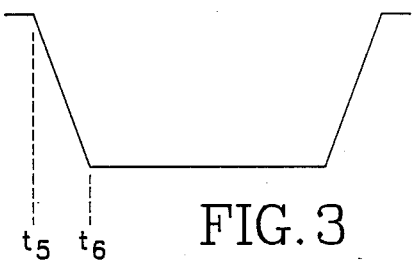
FIG. 3 is an enlarged view of part of FIG. 2.
Figure 4:
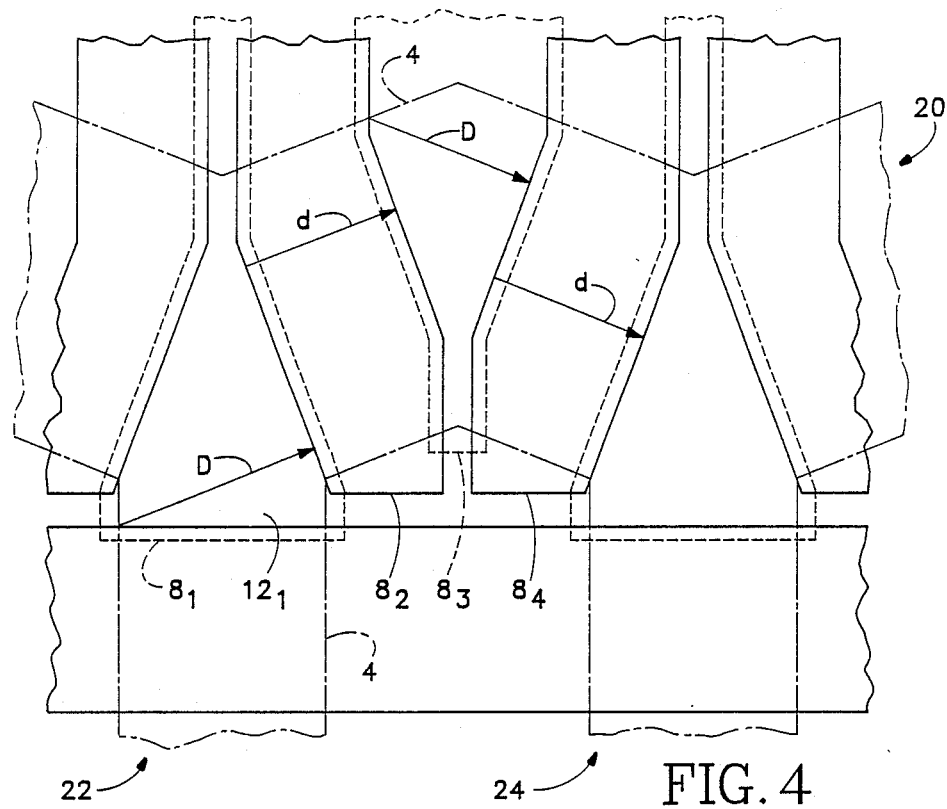
FIG. 4 is a schematic view of a portion of a serial-parallel-serial shift register.
Figure 7:
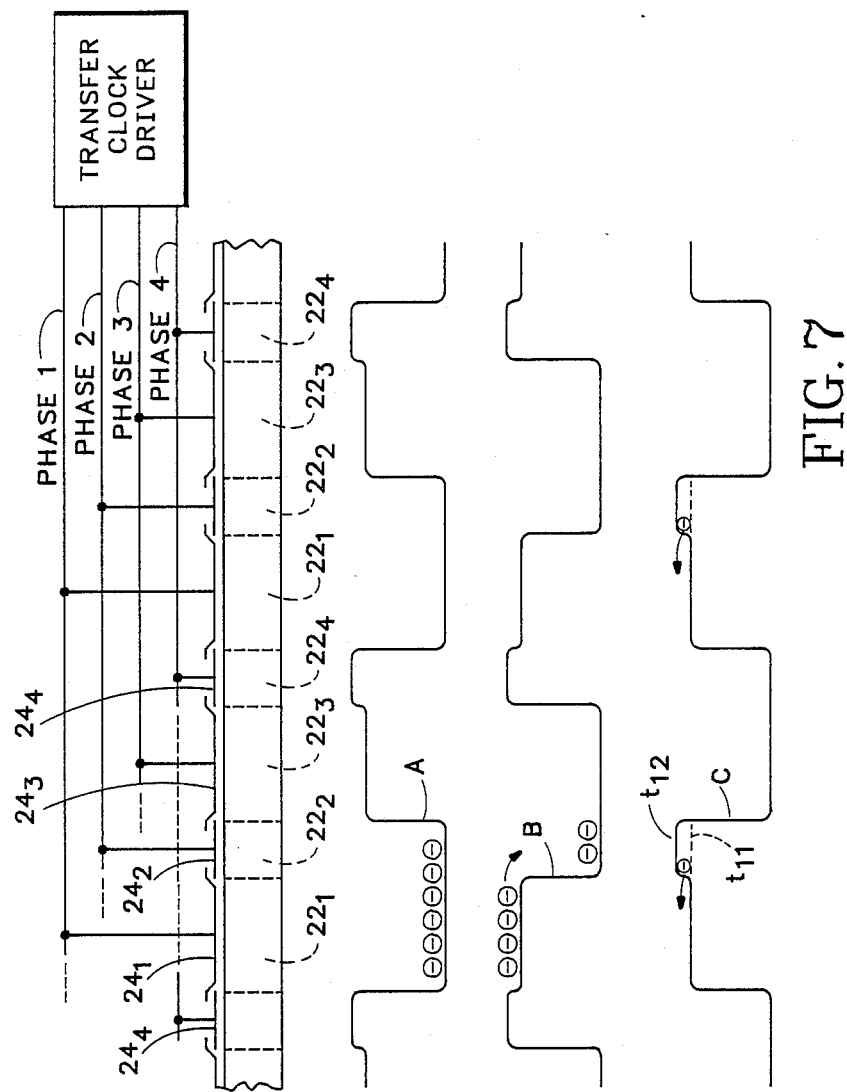
FIG. 7 is a schematic illustration of a four-phase CCD embodying the present invention.
Figure 8:
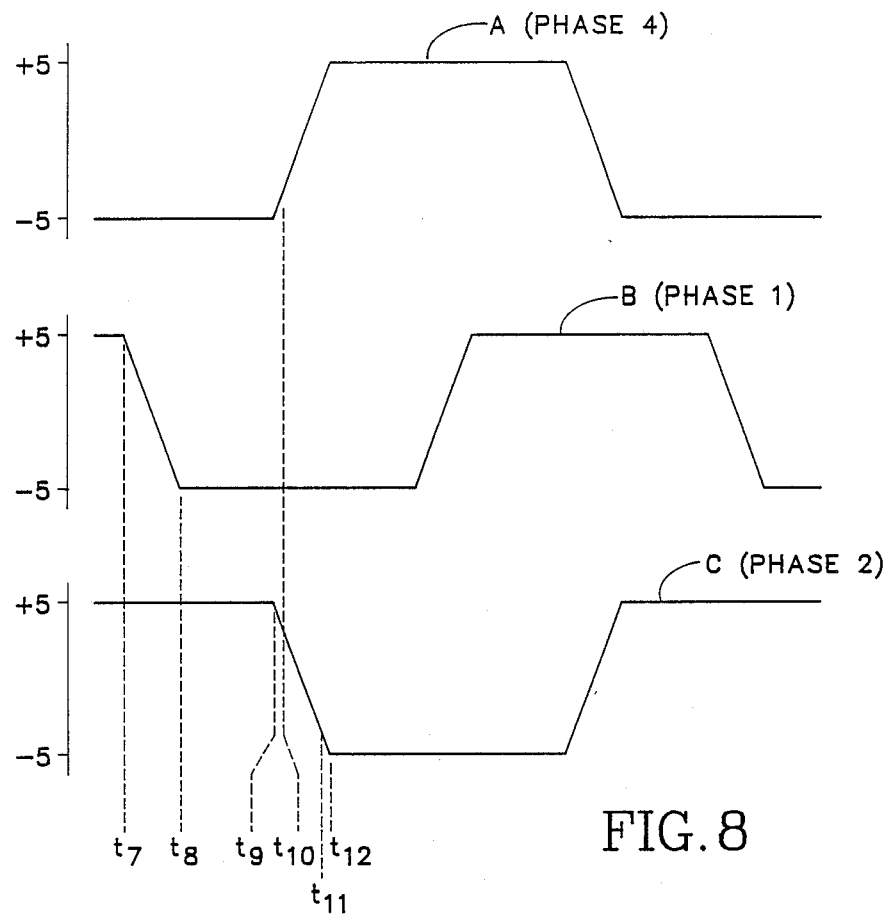
FIG. 8 illustrates voltage waveforms that are utilized in operating the FIG. 7 CCD.

FIG. 7 illustrates schematically a portion of a CCD embodying the invention, and also illustrates the channel potential in the CCD at various times. As shown in FIG. 7, the cells $22_1$ and $22_3$ are longer in the transfer direction than the cells $22_2$ and $22_4$. FIG. 8 illustrates the waveforms of the voltages that are applied to the gates $24_4$ (waveform A), $24_1$ (waveform B) and $24_2$ (waveform C) respectively. Similarly to the case of the FIG. 1 device, the voltage waveform applied to the gate $24_3$ is shifted in phase from the voltage waveform applied to the gates $24_1$ by 180°. As shown in FIG. 8, the negative voltage level for the longer cells is offset by a small amount from the negative voltage level for the shorter cells. The channel potential profile when phases 3 and 4 are low is shown by the waveform A in FIG. 7. Charge is stored in the cells $22_1$ and $22_2$, for which the channel potential is low. Charge starts to transfer from the cell $22_1$ to the succeeding potential well when the phase 1 clock voltage starts to fall, i.e. at the time $t_7$ shown in FIG. 8. At the time $t_8$, the channel potential in the cell $22_1$ reaches its maximum value. The interval between $t_7$ and $t_8$ may be so short that much of the charge present in the cell $22_1$ at the time $t_7$ is still present therein at the time $t_8$. However, the offset in the negative voltage level for the longer cells relative to the shorter cells provides a small potential barrier, which prevents spill back of charge from the cell $22_1$ to the preceding potential well, even when the channel potential in the cell $22_1$ reaches its maximum value (time $t_8$). See FIG. 7, waveform B Spill back from the cell $22_1$ cannot occur until the phase 4 voltage has risen sufficiently that the channel potential in the cell $22_4$ falls below that in the cell $22_1$, which does not occur until the time $t_{10}$, and therefore the time available for forward transfer of charge has increased substantially with respect to the arrangement described with reference to FIGS. 1–5. In a practical implementation, the charge transfer time increases about 2.5 times.

When the phase 2 voltage falls, starting at time $t_9$, the channel potential in the cell $22_2$ rises. At the time $t_{11}$, the channel potential in the cell $22_2$ is equal to that in the cell $22_1$, as indicated by the dashed line in FIG. 7, waveform C, and therefore spill back from the cell $22_2$ is able to take place before the phase 2 voltage reaches its final low level at the time $t_{12}$ and the channel potential in the cell $22_1$ reaches its maximum level, indicated by the solid line in FIG. 7, waveform C. Consequently, using the manner of operation described with reference to FIGS. 7 and 8, slightly less time is available for charge to transfer forward from the shorter cells before spill back occurs, compared to the manner of operation described with reference to FIGS. 1–3. However, this advance in spill back time does not degrade the efficiency of the CCD substantially because the transferring cell is short and a large proportion of the charge is transferred to the receiving cell in the interval from $t_9$ to $t_{11}$. Therefore, the loss in CTE due to earlier spill back from the shorter cells is more than offset by the decrease in spill back from the longer cells.

Figure 5:
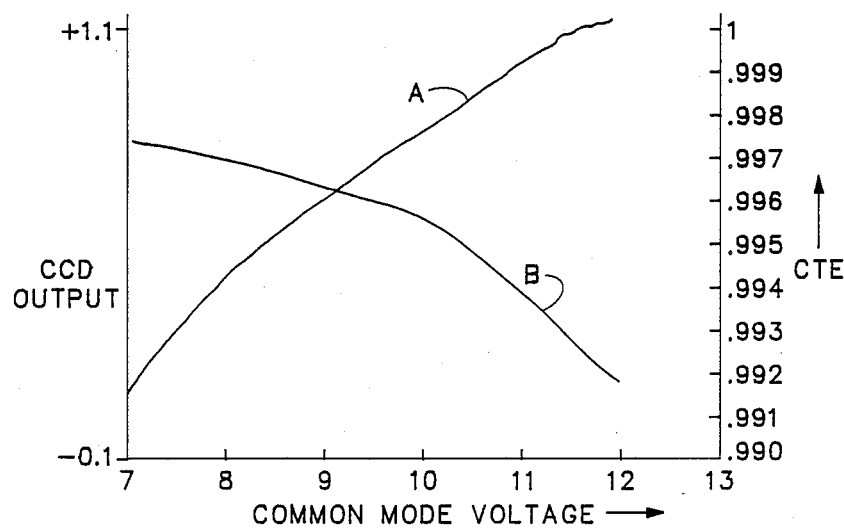
FIG. 5 is a graph illustrating electrical characteristics of a known CCD.
Figure 9:
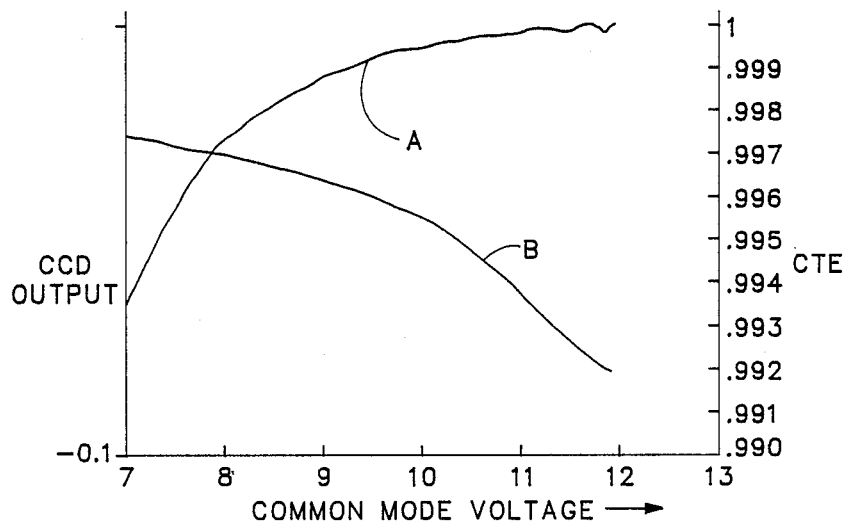
FIG. 9 is a graph illustrating electrical characteristics of a four-phase CCD embodying the invention.

FIG. 9 is similar to FIG. 5, except that it depicts operation of a CCD in accordance with the method described with reference to FIGS. 6 and 7. Again, curve A represents variation in CTE as a function of common mode voltage while curve B represents the differential CCD output as a function of common mode voltage. The configuration of the curve B in FIG. 8 is substantially the same as in FIG. 5, but the configuration of the curve A is changed significantly, and operation of the CCD at a common mode voltage of 9 v provides a CTE of about 0.998.

It will be appreciated by those skilled in the art that the channel potential is not dependent on the gate voltage only, but also depends on the quantity of charge present in the cell. Accordingly, the minimum offset in gate voltage that will provide a sufficient potential barrier to prevent spill back from the longer cells depends on the operating conditions of the CCD.

Figure 6:
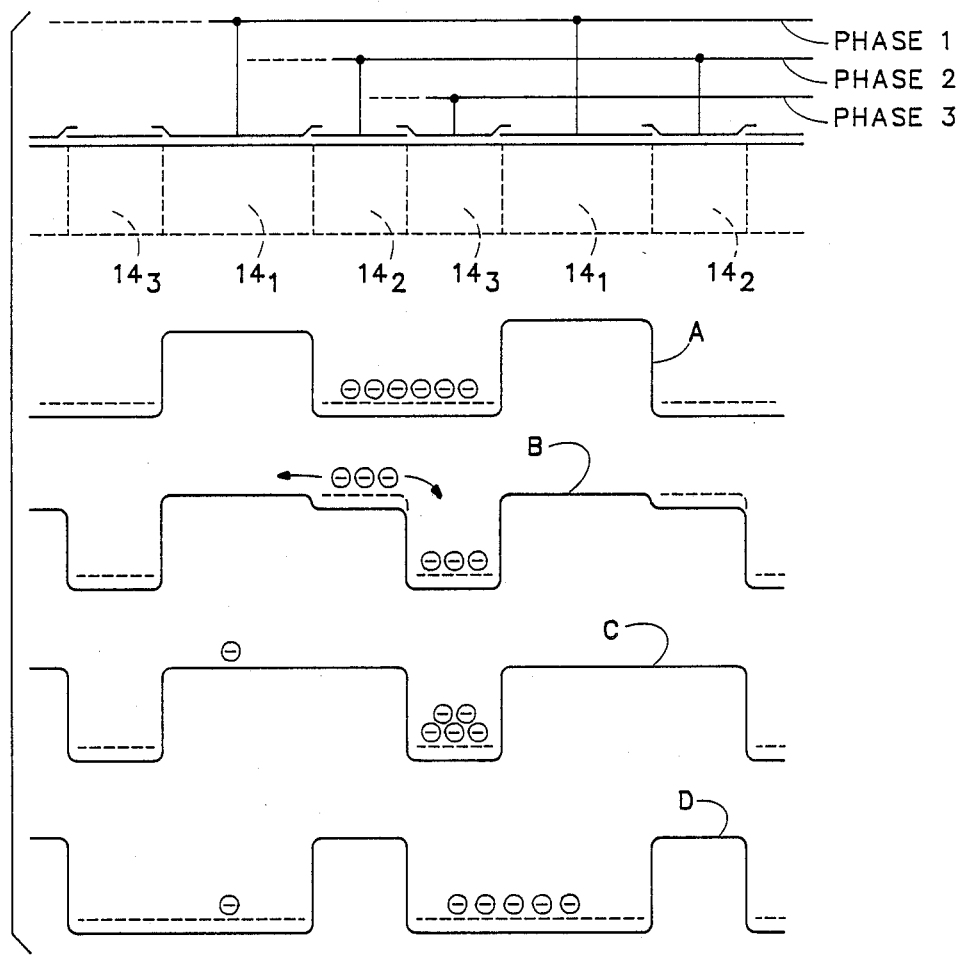
FIG. 6 illustrates a three-phase CCD operated in accordance with known methods.
Figure 10:
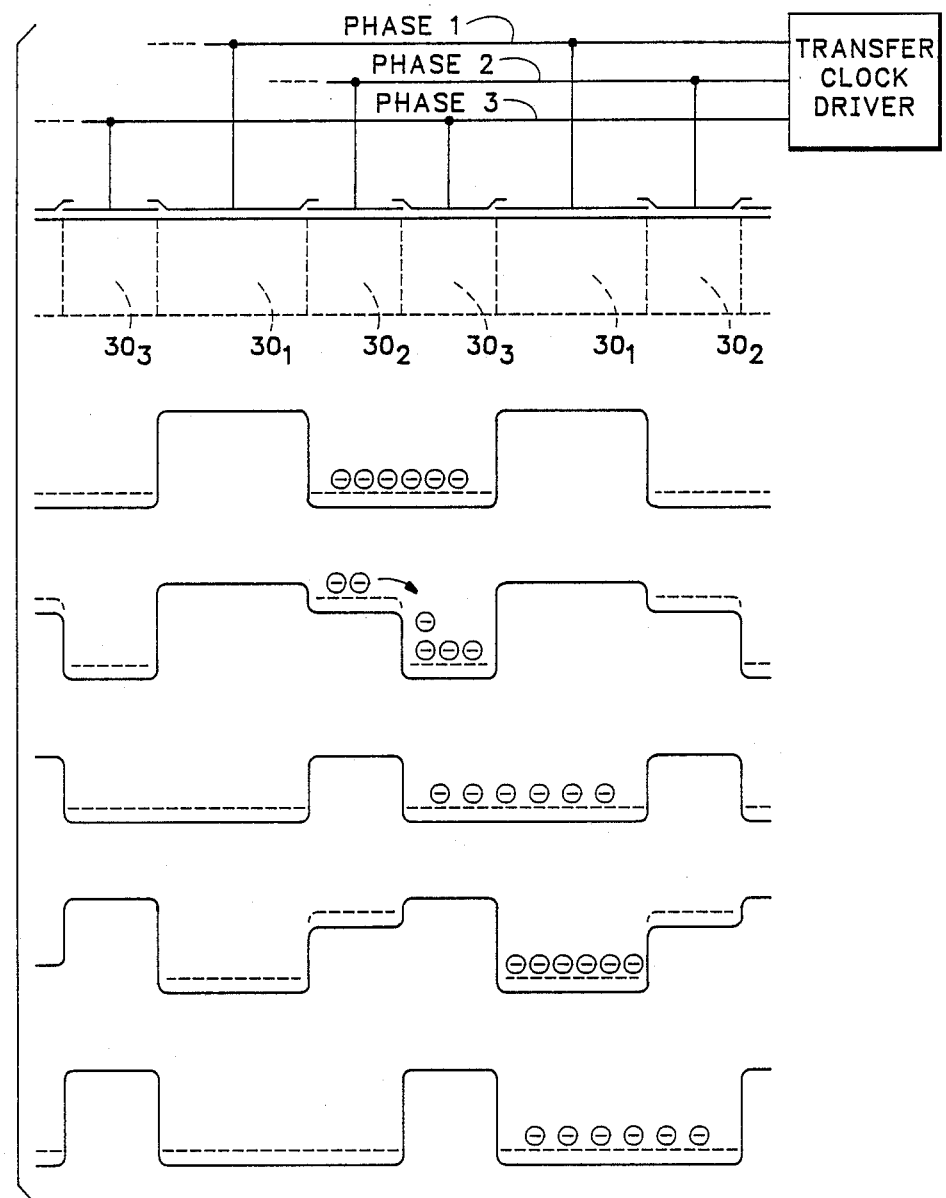
FIG. 10 is a schematic illustration of a three-phase CCD embodying the present invention.

FIG. 10 illustrates a CCD similar to that shown in FIG. 6. However, in the FIG. 10 CCD the low potential level for phase 2 is offset in the positive direction relative to the low potential level for phases 1 and 3, and therefore the maximum channel potential in the cell $30_2$ is lower than the maximum channel potential in the cells $30_1$ and $30_3$ and spill back is reduced.

It will be appreciated that the present invention is not restricted to the particular embodiment that has been described, and that variations may be made therein without departing from the scope of the invention as defined in the appended claims and equivalents thereof. For example, the invention is not limited to use with four-phase CCDs, and is applicable to other CCDs in which the cells of different sets are of different lengths. The invention is not limited to use of an offset in gate voltage to achieve the desired difference in channel potential between long and short cells, since a difference in channel potential may be achieved by adjusting the doping concentration along the channel, the gate dielectric structures and the gate material work functions. However, it is preferred that the offset in gate voltage be employed, since it allows adjustment of the difference in channel potential, and also allows a uniform channel potential in the potential well. Also, electrical control allows the polarity of the difference in channel potential to be changed, e.g. depending on the charge level of the particular application.

I claim:

1. A charge-coupled device comprising:
   a body of semiconductor material having a channel along which charge can be transferred in a predetermined direction by charge carriers of a first polarity,
   a plurality of gates over the channel, the gates being in n sets, where n is an integer greater than two, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, the gates of at least one set being longer in the predetermined direction than the respective preceding gates, and
   means for driving the sets of gates each between first and second potential levels of which the first potential level is of said first polarity relative to said second potential level, the first potential level to which the gates of said one set are driven being different from the first potential level to which said preceding gates are driven and the second potential level to which the gates of said one set are driven being substantially the same as the second potential level to which said preceding gates are driven.

2. A charge-coupled device according to claim 1, wherein the first potential level to which the gates of said one set are driven is of said first polarity relative to the first potential level to which said preceding gates are driven.

3. A charge-coupled device according to claim 1, wherein the first potential level to which the gates of said one set are driven is of a second polarity, opposite said first polarity, relative to the first potential level to which said preceding gates are driven.

4. A charge-coupled device according to claim 3, wherein said channel is of n-type conductivity and the number of sets of gates is four.

5. A charge-coupled device according to claim 4, wherein the gates of the first and third sets are longer in the predetermined direction than the gates of the second and fourth sets, and the first potential level to which the gates of both the first and third sets are driven is of said second polarity relative to the first potential level to which the gates of the second and fourth sets are driven.

6. A charge-coupled device comprising:
a body of semiconductor material having a channel along which charge can be transferred in a predetermined direction by charge carriers of a first polarity,
a plurality of gates over the channel, the gates being in n sets, where n is an integer greater than three, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, at least one gate being longer in the predetermined direction than the preceding gate, and
means for driving the gates each between first and second potential levels of which the first potential level is of said first polarity relative to said second potential level, the first potential level to which said one gate is driven being different from the first potential level to which said preceding gate is driven and the second potential level to which said one gate is driven being substantially the same as the second potential level to which said preceding gate is driven.

7. A charge-coupled device according to claim 6, wherein the first potential level to which said one gate is driven is of said first polarity relative to the first potential level to which said preceding gate is driven.

8. A charge-coupled device according to claim 6, wherein the first potential level to which said one gate driven is of a second polarity, opposite said first polarity, relative to the first potential level to which said preceding gate is driven.

9. A charge-coupled device comprising:
a body of semiconductor material having a channel along which charge can be transferred in a predetermined direction by charge carriers of a first polarity,
a plurality of gates over the channel, the gates being in n sets, where n is an integer greater than unity, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, the gates of at least one set being longer in the predetermined direction than the respective preceding gates, and means for driving the sets of gates each between first and second potential levels of which the first potential level is of said first polarity relative to said second potential level,
the channel potential beneath the gates of said one set when the gates of said one set are at the first potential level thereof being different from the channel potential beneath said preceding gates when said preceding gates are at the first potential level thereof, and the channel potential beneath the gates of said one set when the gates of said one set are at the second potential level thereof being substantially the same as the channel potential beneath said preceding gates when said preceding gates are at the second potential level thereof.

10. A charge-coupled device according to claim 9, wherein the channel potential beneath the gates of said one set when the gates of said one set are at the first potential level thereof is less than the channel potential beneath said preceding gates when said preceding gates are at the first potential level thereof.

11. A charge-coupled device according to claim 9, wherein the channel potential beneath the gates of said one set when the gates of said one set are at the first potential level thereof is greater than the channel potential beneath said preceding gates when said preceding gates are at the first potential level thereof.

12. A method of operating a charge-coupled device comprising a body of semiconductor material having a channel along which charge can be transferred in a predetermined direction by charge carriers of a first polarity, and a plurality of gates over the channel, the gates being in n sets, where n is an integer greater than unity, such that a gate of the first set is preceded by a gate of the nth set in said predetermined direction and is succeeded by a gate of the second set, a gate of the ith set (where i is an integer greater than 1 and less than n) is preceded by a gate of the (n−1)th set and is succeeded by a gate of the (i+1)th set, and a gate of the nth set is preceded by a gate of the (n−1)th set and is succeeded by a gate of the first set, the gates of the jth set, where j is in the range from 1 to n, being longer in the predetermined direction than the gates of the kth set, where the gates of the kth set precede the gates of the jth set, the method comprising:
driving the kth set of gates between first and second potential levels of which the first potential level is of said first polarity relative to said second potential level, and
driving the jth set of gates between third and fourth potential levels of which the third potential level is of said first polarity relative to the fourth potential level and is different from said first potential level and the fourth potential level is substantially the same as the first potential level.

13. A method according to claim 12, wherein the third potential level is of said first polarity relative to said first potential level.

14. A method according to claim 12, wherein the third potential level is of a second polarity, opposite said first polarity, relative to said first potential level.

15. A charge-coupled device comprising:
a body of semiconductor material having a channel along which charge can be transferred in a predetermined direction by charge carriers of a first polarity,
a plurality of gates over the channel, the gates being in n sets, where n is an integer greater than two, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, the gates of at least one set being longer in the predetermined direction than the respective preceding gates, and means for driving the sets of gates each between first and second potential levels of which the first potential level is of said first polarity relative to said second potential level, the first potential level to which the gates of said one set are driven being of said first polarity relative to the first potential level to which said preceding gates are driven.

16. A charge-coupled device comprising:

a body of semiconductor material having a channel along which charge can be transferred in a predetermined direction by charge carriers of a first polarity, a plurality of gates over the channel, the gates being in n sets, where n is an integer greater than three, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, at least one gate being longer in the predetermined direction than the preceding gate, and means for driving the gates each between first and second potential levels of which the first potential level is of said first polarity relative to said second potential level, the first potential level to which said one gate is driven being of said first polarity relative to the first potential level to which said preceding gate is driven.

17. A charge-coupled device comprising:

a body of semiconductor material having a channel along which charge can be transferred in a predetermined direction by charge carriers of a first polarity, a plurality of gates over the channel, the gates being in n sets, where n is an integer greater than unity, such that a gate of the first set is preceded by a gate of the nth set in said predetermined direction and is succeeded by a gate of the second set, a gate of the ith ste (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, the gates of at least one set being longer in the predetermined direction than the respective preceding gates, and means for driving the sets of gates each between first and second potential levels of which the first potential level is of said first polarity relative to said second potential level, the channel potential beneath the gates of said one set when the gates of said one set are at the first potential level thereof being greater than the channel potential beneath said preceding gates when said preceding gates are a the first potential level thereof.

18. A method of operating a charge-coupled device comprising a body of semiconductor material having a channel along which charge can be transferred in a predetermined direction by charge carriers of a first polarity, and a plurality of gates over the channel, the gates being in n sets, where n is an integer greater than unity, such that a gate of the first set is preceded by a gate of the nth set in said predetermined direction and is succeeded by a gate of the second set, a gate of the ith set (where i is an integer greater than 1 and less than n) is preceded by a gate of the (i−1)th set and is succeeded by a gate of the (i+1)th set, and a gate of the nth set is preceded by a gate of the (n−1)th set and is succeeded by a gate of the first set, the gates of the jth set, where j is in the range from 1 to n, being longer in the predetermined direction than the gates of the kth set, where the gates of the kth set precede the gates of the jth set, the method comprising:

driving the kth set of gates between first and second potential levels of which the first potential level is of said first polarity relative to said second potential level, and driving the jth set of gates between third and fourth potential levels of which the third potential level is of said first polarity relative to the fourth potential level and is of said first polarity relative to said first potential level.

* * * * *